(12) United States Patent
Hong et al.

(10) Patent No.: US 12,701,865 B2
(45) Date of Patent: Aug. 4, 2026

(54) DISPLAY DEVICE AND METHOD OF MANUFACTURING THE SAME

(71) Applicant: Samsung Display Co., Ltd., Yongin-Si (KR)

(72) Inventors: Pil Soon Hong, Seoul (KR); Jungi Kim, Hwaseong-si (KR); Hye Sun Kim, Goyang-si (KR); Sanghyun Yun, Suwon-si (KR); Gwangmin Cha, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 382 days.

(21) Appl. No.: 18/218,074

(22) Filed: Jul. 4, 2023

(65) Prior Publication Data

US 2024/0023377 A1     Jan. 18, 2024

(30) Foreign Application Priority Data

Jul. 13, 2022     (KR) ......................... 10-2022-0086119

(51) Int. Cl.
*H10K 59/122*          (2023.01)
*H10K 59/12*          (2023.01)
(Continued)

(52) U.S. Cl.
CPC ....... *H10K 59/122* (2023.02); *H10K 59/1201* (2023.02); *H10K 71/135* (2023.02); *H10K 71/233* (2023.02)

(58) Field of Classification Search
CPC ............. H10K 59/122; H10K 59/1201; H10K 71/135; H10K 71/233; H10K 50/11;
(Continued)

(56) References Cited

U.S. PATENT DOCUMENTS 7,948,167 B2     5/2011   Chung et al.
2008/0290790 A1*  11/2008   Jin ....................... H10K 59/122
                                                                                  445/24
(Continued)

FOREIGN PATENT DOCUMENTS

KR          10-0747430 B1     8/2007
KR     10-2009-0001375 A     1/2009
(Continued)

*Primary Examiner* — Elmito Breval
(74) *Attorney, Agent, or Firm* — Innovation Counsel LLP

(57)          ABSTRACT
A display device is disclosed that includes a substrate, a pixel electrode, a sacrificial layer, a pixel defining layer, a conductive layer, a light emitting material, and a common electrode. The pixel electrode is arranged on the substrate. The sacrificial layer is arranged on the pixel electrode so as to be adjacent to an outer boundary of the pixel electrode when viewed in a plan view. The pixel defining layer is arranged on the substrate, coming into direct contact with an entire top surface of the sacrificial layer, and defining a pixel opening exposing a part of the pixel electrode. The conductive layer covers a side surface of the pixel defining layer defining the pixel opening. The light emitting material is arranged on the pixel electrode within the pixel opening. The common electrode includes a first common electrode covering a top surface of the light emitting material in the pixel opening, and a second common electrode covering a top surface of the pixel defining layer.

11 Claims, 15 Drawing Sheets

CE:CE1,CE2

(51) Int. Cl.
     *H10K 71/13*        (2023.01)
     *H10K 71/20*        (2023.01)

(58) Field of Classification Search
     CPC .... H10K 50/81; H10K 50/822; H10K 50/844;
               H10K 59/131; H10K 59/80515; H10K
                       71/00; H10K 2102/101
     See application file for complete search history.

(56)             References Cited

U.S. PATENT DOCUMENTS

| | | | |
|---|---|---|---|
| 2010/0164377 A1* | 7/2010 | Shimizu ............... | H10K 59/122 |
| | | | 313/504 |
| 2020/0194524 A1 | 6/2020 | Ding et al. | |
| 2020/0373364 A1 | 11/2020 | Yoon et al. | |
| 2021/0119183 A1 | 4/2021 | Lee et al. | |
| 2022/0209174 A1* | 6/2022 | Woo ..................... | H10K 59/122 |

FOREIGN PATENT DOCUMENTS

| | | | | |
|---|---|---|---|---|
| KR | 20090021443 A | * | 3/2009 | ............ H10D 30/67 |
| KR | 10-1525804 B1 | | 6/2015 | |
| KR | 10-2016-0037366 A | | 4/2016 | |
| KR | 10-2089248 B1 | | 3/2020 | |
| KR | 10-2020-0135682 A | | 12/2020 | |
| KR | 10-2229324 B1 | | 3/2021 | |
| KR | 10-2021-0045658 A | | 4/2021 | |

* cited by examiner

DISPLAY DEVICE AND METHOD OF MANUFACTURING THE SAME

CROSS-REFERENCE TO RELATED APPLICATION

This application claims priority under 35 USC § 119 to Korean Patent Application No. 10-2022-0086119 filed on Jul. 13, 2022 in the Korean Intellectual Property Office (KIPO), the entire disclosure of which is incorporated herein by reference.

BACKGROUND

1. Field

The present disclosure relates to an organic light emitting display device and a method of manufacturing the same.

2. Description of the Related Art

A display device may include a plurality of pixels, and a display device manufacturing process includes producing the plurality of pixels.

Recently, the pixel manufacturing process using an inkjet scheme for injetting ink containing a light-emitting material into a pixel opening has been studied.

SUMMARY

The present disclosure may provide a display device having improved display quality.

The present disclosure may provide a method of manufacturing the display device.

An embodiment of a display device includes: a substrate; a pixel electrode arranged on the substrate; a sacrificial layer arranged on the pixel electrode so as to be adjacent to an outer boundary of the pixel electrode when viewed in a plan view; a pixel defining layer arranged on the substrate, coming into direct contact with an entire top surface of the sacrificial layer, and defining a pixel opening exposing a part of the pixel electrode; a conductive layer covering a side surface of the pixel defining layer defining the pixel opening; a light emitting material arranged on the pixel electrode within the pixel opening; and a common electrode including a first common electrode covering a top surface of the light emitting material in the pixel opening, and a second common electrode covering a top surface of the pixel defining layer.

In an embodiment, the pixel-defining layer may define an undercut space while being spaced apart from a part of the pixel electrode adjacent to the sacrificial layer, and the conductive layer may be spaced apart from the pixel electrode.

In an embodiment, the light emitting material may fill the undercut space, and the light emitting material may be arranged between the conductive layer and the pixel electrode.

In an embodiment, each of the first common electrode and the second common electrode may come into direct contact with the conductive layer.

In an embodiment, the sacrificial layer may be separated from the conductive layer.

In an embodiment, the side surface of the pixel defining layer may have a reverse taper shape with respect to a top surface of the pixel electrode.

In an embodiment, the conductive layer may further extend from the side surface of the pixel defining layer to the top surface of the pixel defining layer adjacent to the side surface of the pixel defining layer.

In an embodiment, the second common electrode may further cover the conductive layer arranged on the top surface of the pixel defining layer.

In an embodiment, the display device may further include a protective pattern arranged on the top surface of the pixel defining layer.

In an embodiment, the protective pattern may include a material identical to the conductive layer.

In an embodiment, the second common electrode may further cover the protective pattern.

An embodiment of a method of manufacturing a display device includes the steps of: forming a pixel electrode on a substrate; forming a preliminary sacrificial layer on the pixel electrode to cover a top surface of the pixel electrode; forming a pixel defining layer including a side surface defining a pixel opening exposing a part of a top surface of the preliminary sacrificial layer above the substrate; forming a conductive layer covering the side surface of the pixel defining layer; forming a sacrificial layer arranged on the pixel electrode so as to be adjacent to an outer boundary of the pixel electrode when viewed in a plan view, by removing a part of the preliminary sacrificial layer; forming a light emitting material within the pixel opening; and forming a common electrode including a first common electrode covering a top surface of the light emitting material in the pixel opening, and a second common electrode covering a top surface of the pixel defining layer.

In an embodiment, the forming of the light emitting material may include forming the light emitting material by using an inkjet scheme for discharging ink containing the light emitting material into the pixel opening.

In an embodiment, the pixel-defining layer may have ink-phobic properties for the ink, and the conductive layer may have ink-philic properties to the ink.

In an embodiment, the forming of the conductive layer may include: forming a preliminary conductive layer covering the top surface of the pixel defining layer, the side surface of the pixel defining layer, and the part of the top surface of the preliminary sacrificial layer exposed by the pixel opening; and removing the preliminary conductive layer covering the top surface of the pixel defining layer and the part of the top surface of the preliminary sacrificial layer exposed by the pixel opening by using an anisotropic dry etching scheme.

In an embodiment, the forming of the conductive layer may include: forming a photoresist material on the preliminary conductive layer to cover the preliminary conductive layer; and forming a photoresist pattern arranged on a part of the top surface of the pixel defining layer adjacent to the side surface of the pixel defining layer, by removing a part of the photoresist material.

In an embodiment, the photoresist pattern may be further formed on other part of the top surface of the pixel defining layer spaced apart from the side surface of the pixel defining layer.

In an embodiment, the removing of the part of the preliminary sacrificial layer may include: removing the part of the preliminary sacrificial layer by a wet etching scheme using an etching solution.

In an embodiment, an etching ratio of the preliminary sacrificial layer to the etching solution may be greater than an etching ratio of the pixel electrode to the etching solution, and greater than an etching ratio of the conductive layer to the etching solution.

In an embodiment, the removing of the part of the pre-sacrificial layer may further include: forming an undercut space defined when the pixel defining layer is spaced apart from a part of the pixel electrode adjacent to the sacrificial layer, wherein the light emitting material may be formed to fill the undercut space.

The method of manufacturing the display device according to the embodiments of the present disclosure may include the steps of: forming a preliminary sacrificial layer on the pixel electrode; forming a pixel defining layer including a side surface defining a pixel opening, and forming a sacrificial layer by removing a part of the preliminary sacrificial layer. Accordingly, even when a residual organic insulating material is formed upon forming the pixel defining layer, the residual organic insulating material can be formed on the preliminary sacrificial layer, and the residual organic insulating material can be removed simultaneously when the part of the preliminary sacrificial layer is removed. Accordingly, defects in the display device due to residual materials in the pixel opening can be prevented.

In addition, the method of manufacturing the display device according to the embodiments of the present disclosure may include: forming a conductive layer covering the side surface of the pixel defining layer. When the light emitting material is formed in the pixel opening, the conductive layer can prevent the light emitting material from overflowing out of the pixel opening. Accordingly, defects in the display device due to the overflow of the light emitting material can be prevented.

However, the effects according to the present disclosure is not limited to the above-described effects, and may be variously expanded without departing from the idea and scope of the present disclosure.

DETAILED DESCRIPTION OF THE EMBODIMENTS

Figure 1:
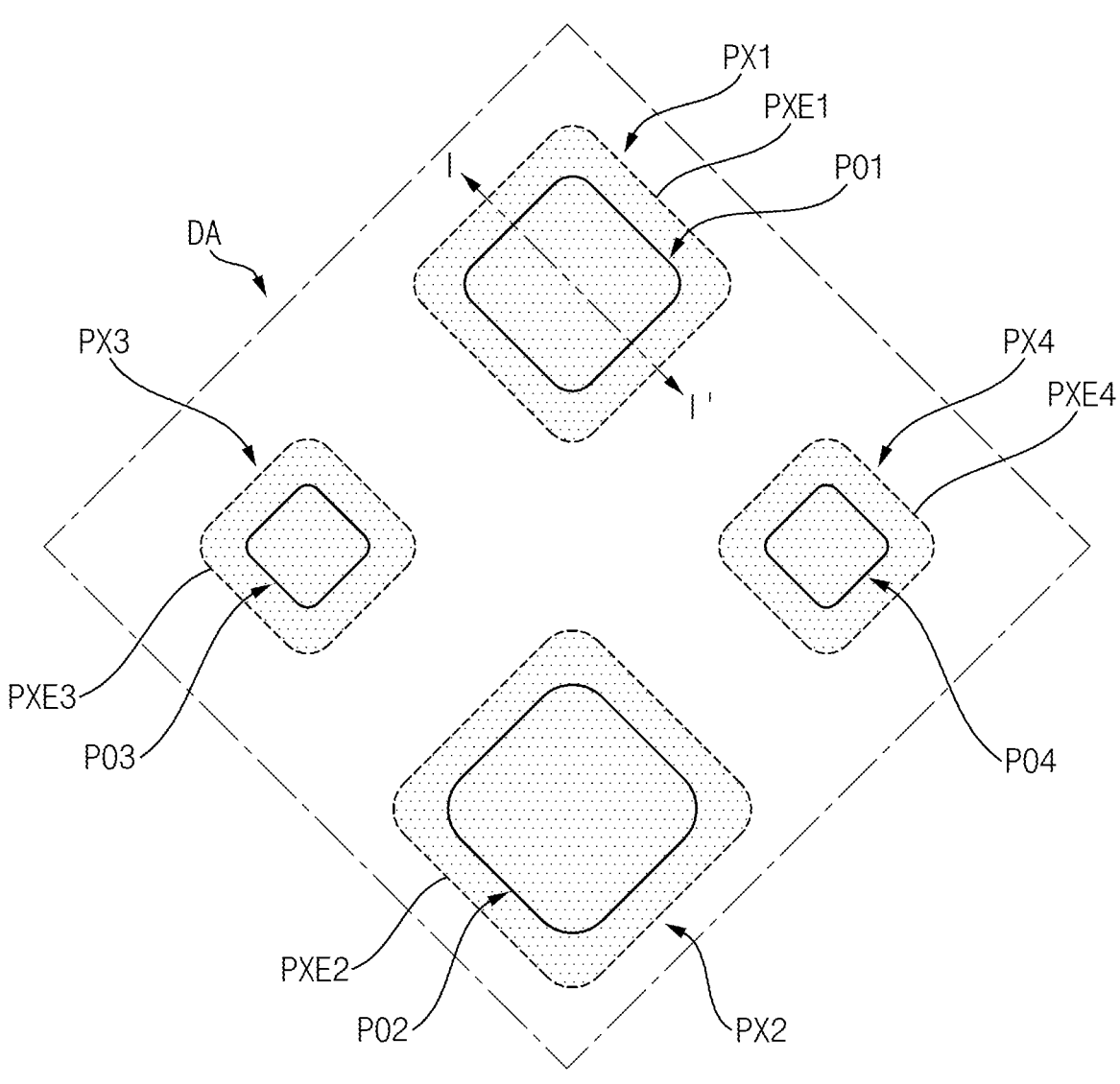
FIGS. 1 and 2 are views for explaining a display device according to an embodiment of the present disclosure.

Hereinafter, a display device and a method of manufacturing the same according to the embodiments of the present disclosure will be described in more detail with reference to the accompanying drawings. The same or similar reference numerals are used for the same components in the accompanying drawings.

Figure 2:
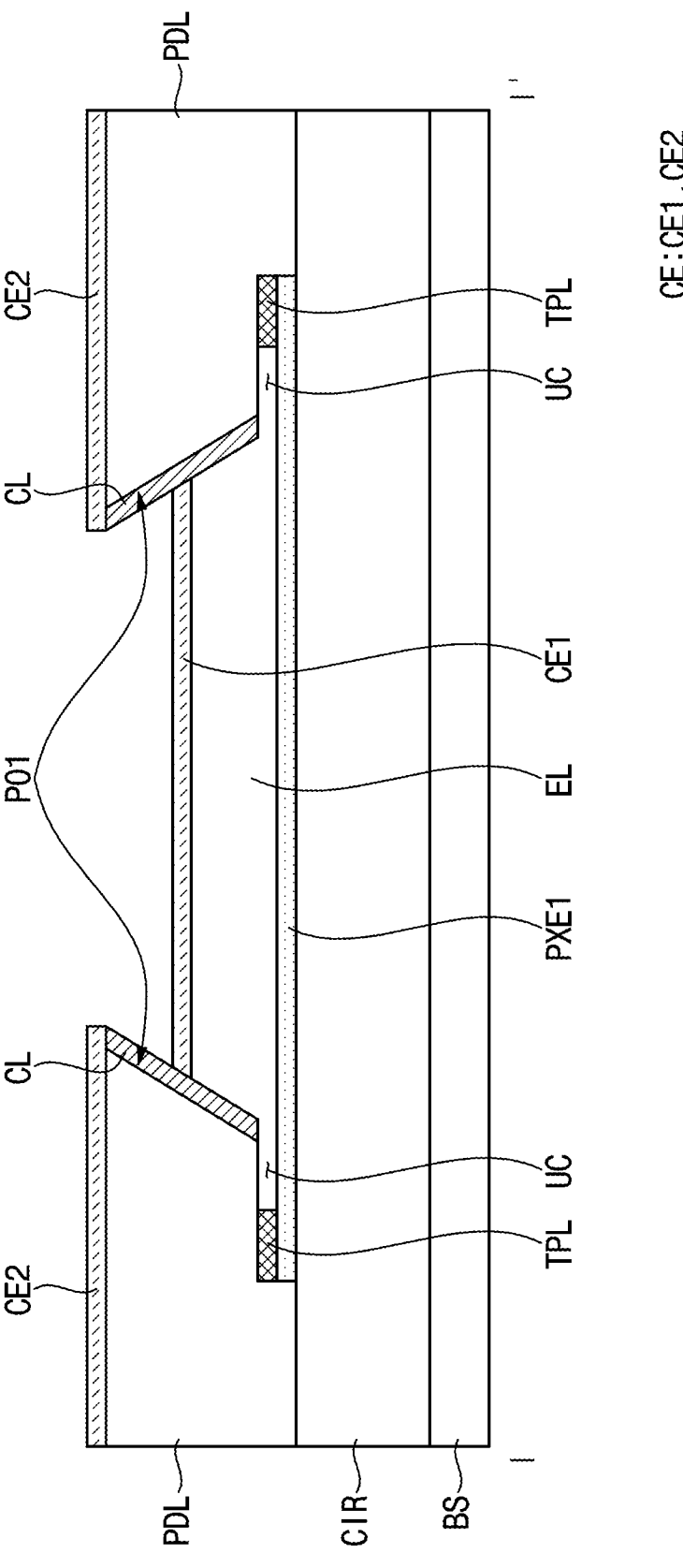

FIGS. 1 and 2 are views for explaining a display device according to an embodiment of the present disclosure. FIG. 1 is a plan view showing a part of the display device according to an embodiment of the present disclosure. FIG. 2 is a sectional view taken along line I-I' of FIG. 1.

Referring to FIG. 1, the display device according to an embodiment of the present disclosure may include a display area DA. A plurality of pixels for emitting light may be arranged in the display area DA, and accordingly, an image may be displayed in the display area DA. For convenience of description, FIG. 1 merely shows a part of the display area DA and first to fourth pixels PX1, PX2, PX3 and PX4 arranged in the part of the display area DA.

The first to fourth pixels PX1, PX2, PX3 and PX4 may be arranged in various shapes when viewed in a plan view. For example, As shown in FIG. 1, the first to fourth pixels PX1, PX2, PX3 and PX4 may be arranged to overlap with four vertexes of an imaginary quadrangle (not shown). However, the present disclosure is not limited thereto, and the arrangement of the first to fourth pixels PX1, PX2, PX3 and PX4 may be variously varied.

The first to fourth pixels PX1, PX2, PX3 and PX4 may include first to fourth pixel electrodes PXE1, PXE2, PXE3 and PXE4. The first to fourth pixel electrodes PXE1, PXE2, PXE3 and PXE4 may have the area different from each other or substantially the same. For example, as shown in FIG. 1, the planar area of the first pixel electrode PXE1 may be smaller than the planar area of the second pixel electrode PXE2, and greater than the planar area of the third pixel electrode PXE3, and the planar area of the third pixel electrode PXE3 may be substantially equal to the planar area of the fourth pixel electrode PXE4. However, the present disclosure is not limited thereto, and the areas of the first to fourth pixel electrodes PXE1, PXE2, PXE3 and PXE4 may be variously varied. The first to fourth pixels PX1, PX2, PX3 and PX4 may have first to fourth openings PO1, PO2, PO3 and PO4.

The first to fourth pixels PX1, PX2, PX3 and PX4 may emit light of colors different from each other or substantially the same. For example, the first pixel PX1 may emit red light, the second pixel PX2 may emit blue light, and the third pixel PX3 and the fourth pixel PX4 may emit green light. However, the present disclosure is not limited thereto, and the colors of light emitted from the first to fourth pixels PX1, PX2, PX3 and PX4 may be variously varied.

As described above, the first to fourth pixels PX1, PX2, PX3 and PX4 may have substantially the same structure, except for the planar area and the emitted light color. Accordingly, hereinafter, only the first pixel PX1 will be described.

Referring to FIGS. 1 and 2, the display device according to an embodiment of the present disclosure may include a base substrate BS, a circuit layer CIR, a first pixel electrode PXE1, a sacrificial layer TPL, a pixel defining layer PDL, a light emitting material EL, a conductive layer CL, and a common electrode CE. The circuit layer CIR, the first pixel electrode PXE1, the light emitting material EL, and the common electrode CE may define the first pixel PX1.

The base substrate BS may include glass, plastic, and the like. In an embodiment, the base substrate BS may further include at least one insulating layer.

The circuit layer CIR may be arranged on the base substrate BS. The circuit layer CIR may include at least one transistor. For example, the circuit layer CIR may include a first driving transistor. In an embodiment, the circuit layer CIR may have a substantially flat top surface.

The first pixel electrode PXE1 may be arranged on the circuit layer CIR. The first pixel electrode PXE1 may be electrically connected to a transistor included in the circuit layer CIR. The first pixel electrode PXE1 may include a conductive material. For example, the first pixel electrode PXE1 may include metal, metal oxide and the like. In an embodiment, the first pixel electrode PXE1 may be referred to as an anode electrode.

As shown in FIG. 2, the sacrificial layer TPL may be arranged on both sides of the first pixel electrode PXE1 when viewed in a sectional view. Although not shown in FIG. 1, the sacrificial layer TPL may be arranged to surround a first pixel opening PO1 along an outer boundary of the first pixel electrode PXE1 when viewed in a plan view. In an embodiment, the sacrificial layer TPL may include metal oxide. For example, the sacrificial layer TPL may include indium gallium zinc oxide (IGZO).

The pixel defining layer PDL may be arranged on the circuit layer CIR. The pixel defining layer PDL may overlap with the sacrificial layer TPL, and may overlap with a part of the first pixel electrode PXE1 adjacent to the sacrificial layer TPL. The pixel defining layer PDL may come into direct contact with a top surface of the sacrificial layer TPL, and may be spaced apart from the part of the first pixel electrode PXE1. A space between the pixel defining layer PDL and the part of the first pixel electrode PXE1 may be defined as an undercut space UC.

The pixel defining layer PDL may define the first pixel opening PO1 that opens at least a part of the first pixel electrode PXE1. The first pixel opening PO1 may be defined by a side surface of the pixel defining layer PDL, in which the side surface of the pixel defining layer PDL may have a reverse tapered shape with respect to the top surface of the circuit layer CIR.

The pixel defining layer PDL may include an organic insulating material. For example, the pixel defining layer PDL may include polyimide-based resin, acrylic resin, poly-acrylic resin, and the like.

The conductive layer CL may cover the side surface of the pixel defining layer PDL. The conductive layer CL may be spaced apart from the first pixel electrode PXE1 and the sacrificial layer TPL. The conductive layer CL may include a conductive material. For example, the conductive layer CL may include metal, metal oxide and the like.

The light emitting material EL may be arranged on the first pixel electrode PXE1 within the first pixel opening PO1. The light emitting material EL may fill the undercut space UC. Accordingly, the light emitting material EL may be arranged between the conductive layer CL and the first pixel electrode PXE1. In an embodiment, the light emitting material EL may include an organic light emitting material.

The common electrode CE may be arranged on the pixel defining layer PDL and the light emitting material EL. The common electrode CE may include a conductive material having relatively high light transmittance. In an embodiment, the common electrode CE may be referred to as a cathode electrode.

The common electrode CE may include a first common electrode CE1 and a second common electrode CE2. The first common electrode CE1 may cover a top surface of the light emitting material EL within the first pixel opening PO1. The first common electrode CE1 may come into contact with the conductive layer CL within the first pixel opening PO1. The second common electrode CE2 may cover a top surface of the pixel defining layer PDL. The second common electrode CE2 may come into contact with an upper portion of the conductive layer CL. In other words, each of the first common electrode CE1 and the second common electrode CE2 may come into contact with the conductive layer CL. Accordingly, the first common electrode CE1 and the second common electrode CE2 may be electrically connected to each other through the conductive layer CL.

FIGS. 3 to 8 are views for explaining a method for manufacturing a display device according to an embodiment of the present disclosure.

Figure 3:
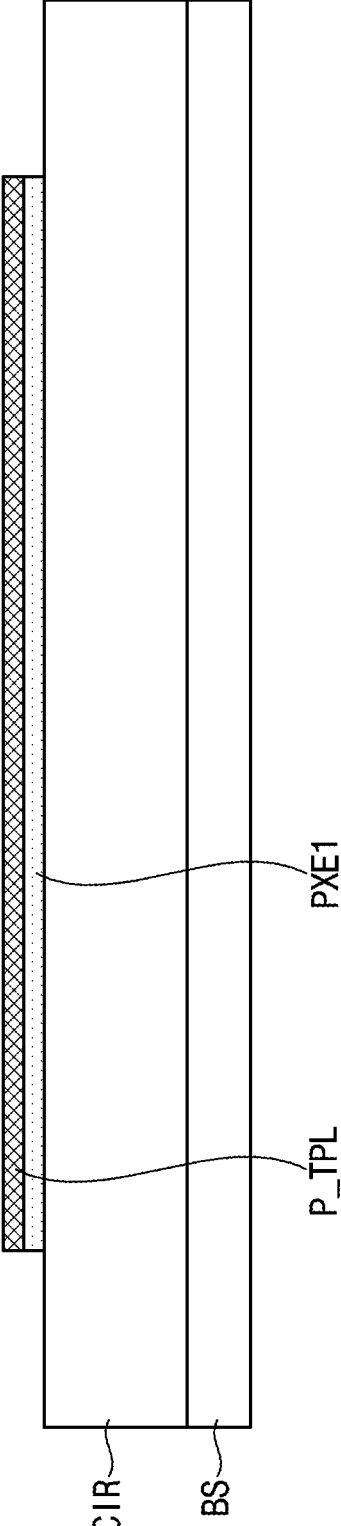
FIGS. 3, 4, 5, 6, 7, and 8 are views for explaining a method for manufacturing a display device according to an embodiment of the present disclosure.

Referring to FIG. 3, the circuit layer CIR may be formed on the substrate BS and then a first pixel electrode PXE1 and a preliminary sacrificial layer P_TPL may be formed on the circuit layer CIR. The preliminary sacrificial layer P_TPL may include the same material as the sacrificial layer TPL, and may cover the entire top surface of the first pixel electrode PXE1.

Figure 4:
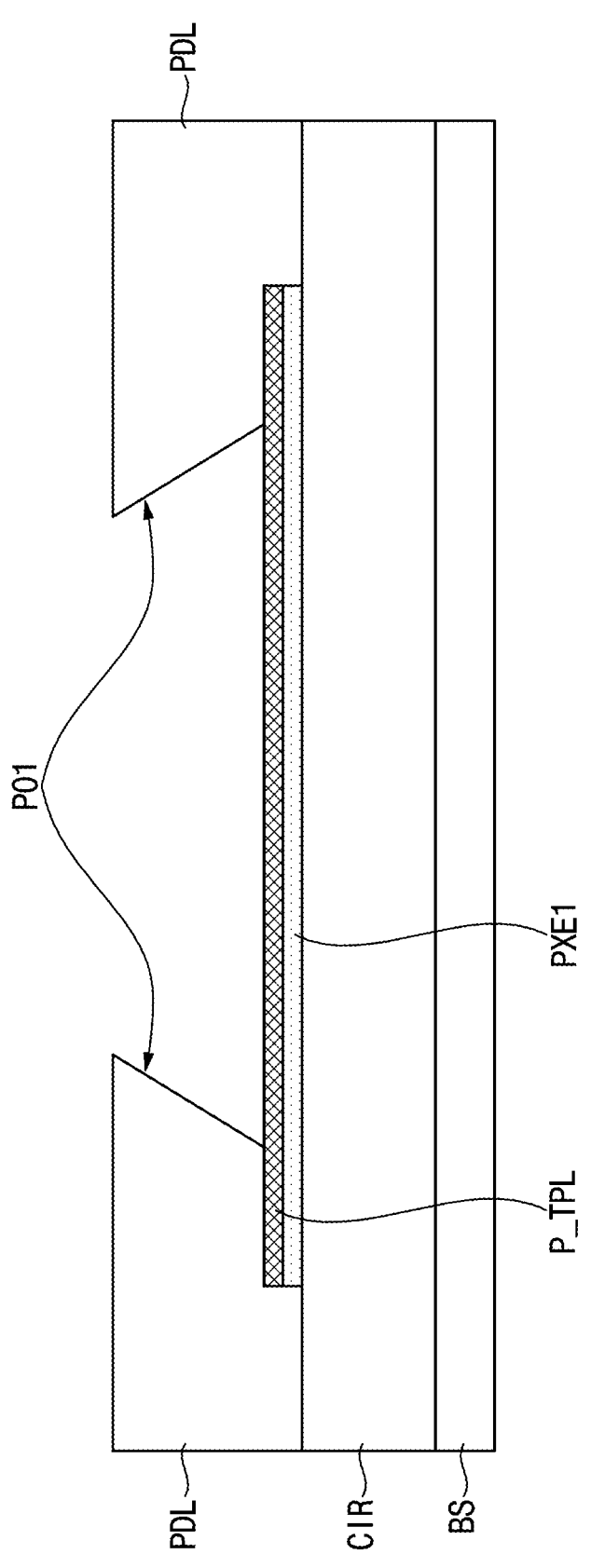

Referring to FIG. 4, a pixel defining layer PDL defining a first pixel opening PO1 exposing at least a part of the preliminary sacrificial layer P_TPL may be formed on the circuit layer CIR. The first pixel opening PO1 may be defined by the side surface of the pixel defining layer PDL, and the side surface of the pixel defining layer PDL may have a reverse tapered shape with respect to the top surface of the circuit layer CIR. The pixel defining layer PDL defining the first pixel opening PO1 may be formed by entirely coating the organic insulating material covering the first pixel electrode PXE1 and the preliminary sacrificial layer P_TPL on the circuit layer CIR, and then removing a part of the organic insulating material corresponding to the first pixel opening PO1.

Figure 5:
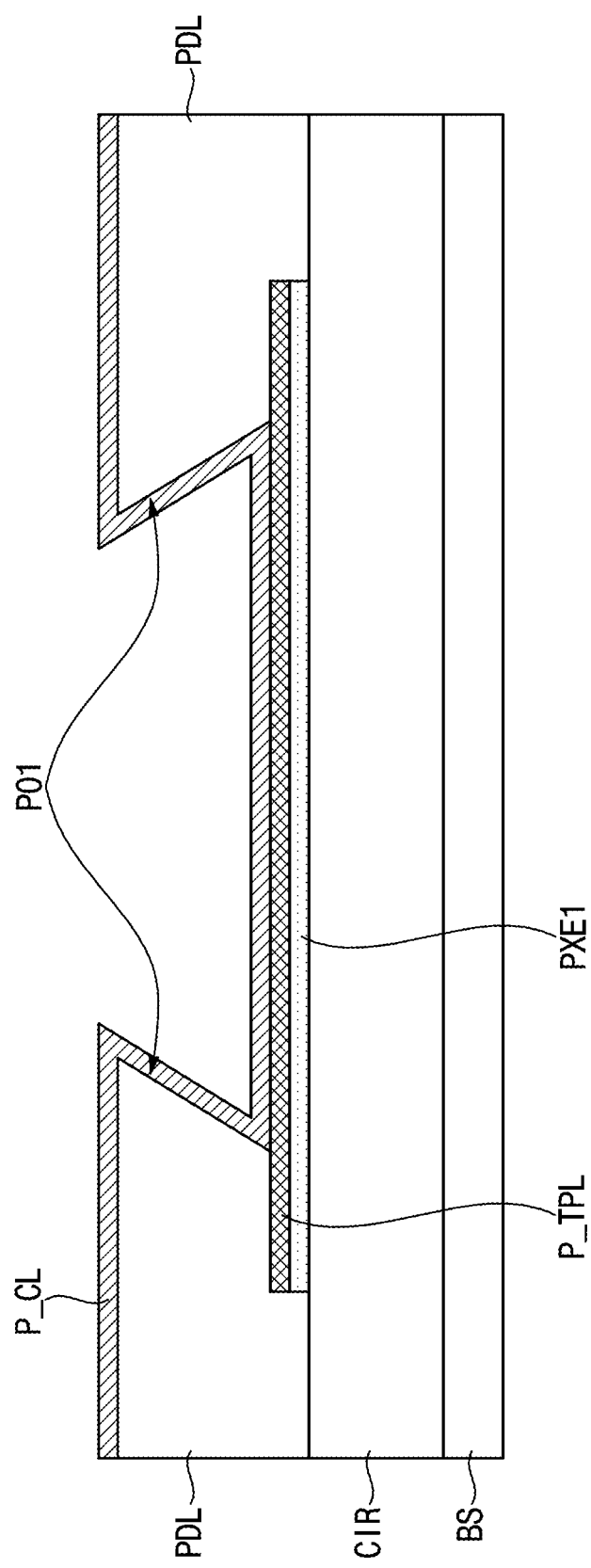

Referring to FIG. 5, a preliminary conductive layer P_CL, which covers the top surface of the pixel defining layer PDL, the side surface of the pixel defining layer PDL, and a top surface of the preliminary sacrificial layer P_TPL exposed by the first pixel opening PO1, may be formed. In an embodiment, the preliminary conductive layer P_CL may be formed by sputtering scheme. The deposition thickness of the preliminary conductive layer P_CL is configured to be relatively thick, so that the preliminary conductive layer P_CL may be entirely deposited on the top surface of the pixel defining layer PDL, the side surface of the pixel defining layer PDL, and the top surface of the preliminary sacrificial layer P_TPL exposed by the first pixel opening PO1.

Figure 6:
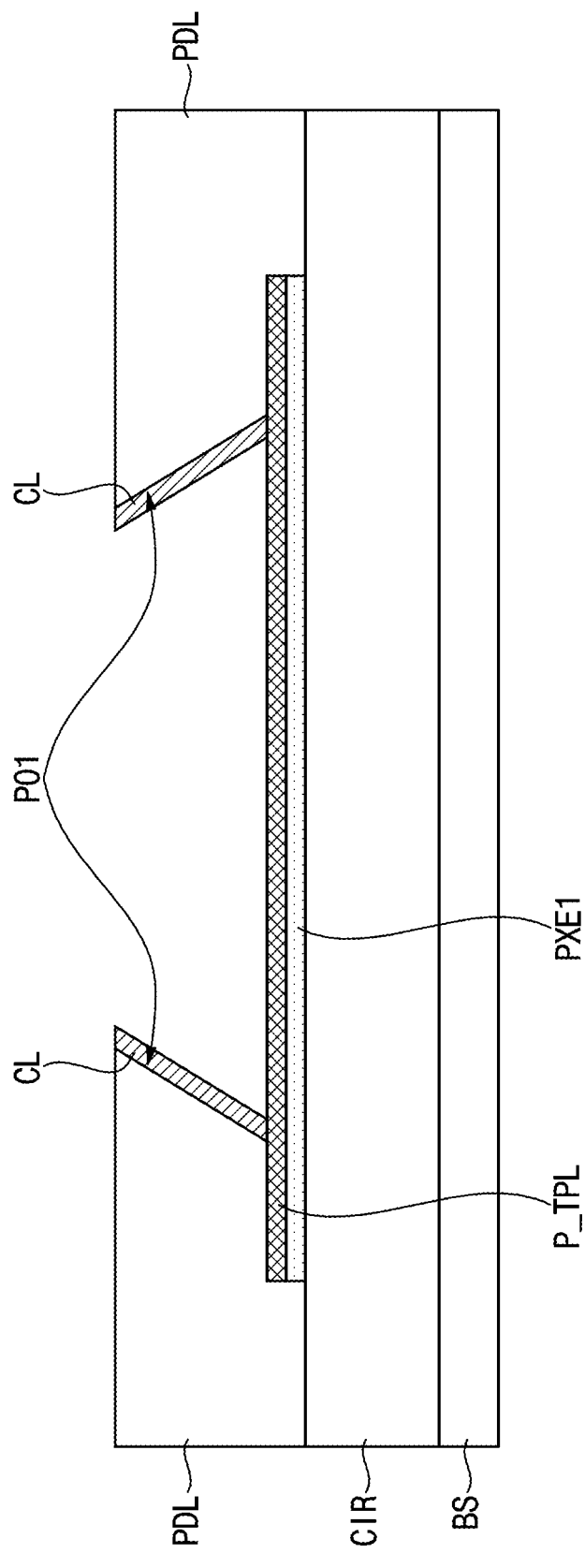

Referring to FIG. 6, the conductive layer CL may be formed by removing a part of the preliminary conductive layer P_CL. For example, the conductive layer CL covering the side surface of the pixel defining layer PDL may be formed by removing the part of the preliminary conductive layer P_CL by an anisotropic dry etching scheme.

The preliminary sacrificial layer P_TPL covers the entire top surface of the first pixel electrode PXE1, so that the first pixel electrode PXE1 may not be substantially removed by the anisotropic dry etching scheme. In other words, the preliminary sacrificial layer P_TPL may protect the first pixel electrode PXE1 from being etched by the anisotropic dry etching scheme.

Figure 7:
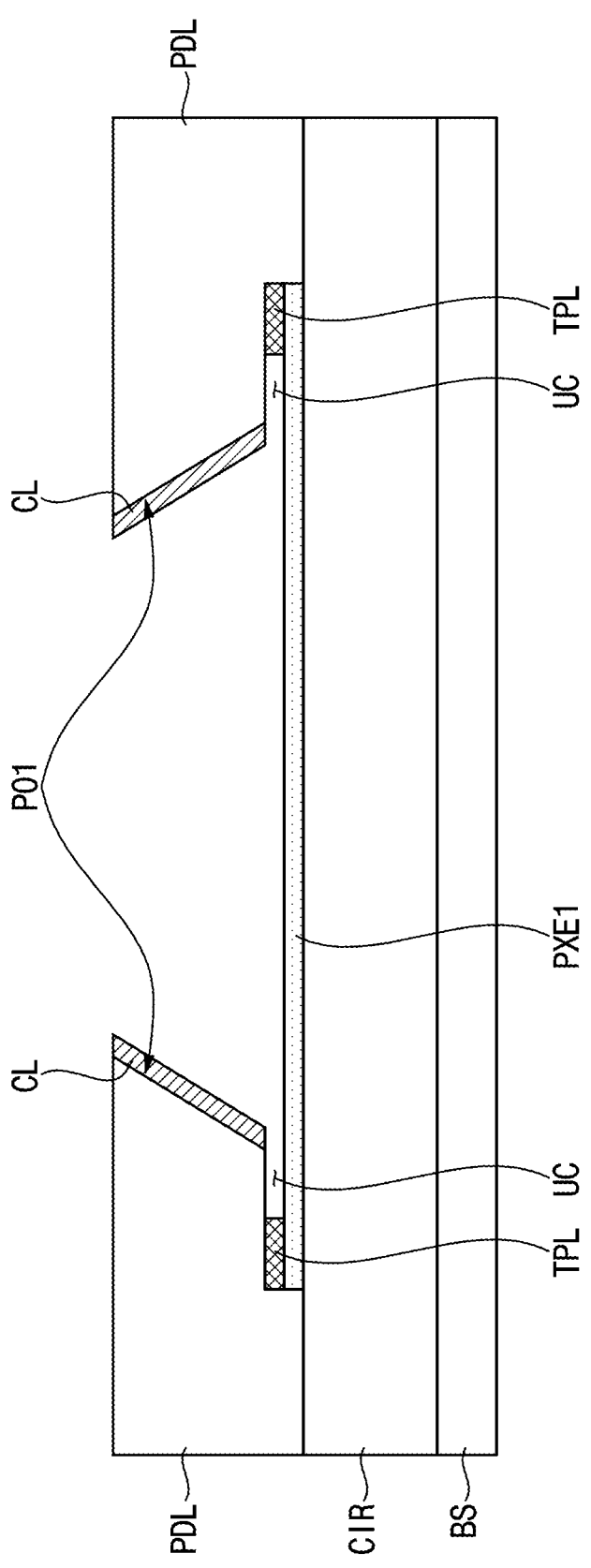

Referring to FIG. 7, the sacrificial layer TPL may be formed by removing a part of the preliminary sacrificial layer P_TPL. The part of the preliminary sacrificial layer P_TPL may be removed by a wet etching scheme using a developing solution. The part of the preliminary sacrificial layer P_TPL is removed, so that the undercut space UC in which the first pixel electrode PXE1 is spaced apart from the pixel defining layer PDL may be defined.

The etching ratio of the preliminary sacrificial layer P_TPL with respect to the developing solution may be greater than the etching ratio of the first pixel electrode PXE1 with respect to the developing solution. Accordingly, when the part of the preliminary sacrificial layer P_TPL is removed by the wet etching scheme, the first pixel electrode PXE1 may not be substantially removed.

In addition, the etching ratio of the preliminary sacrificial layer P_TPL with respect to the developing solution may be greater than the etching ratio of the conductive layer CL with respect to the developing solution. Accordingly, when the part of the preliminary sacrificial layer P_TPL is removed by the wet etching scheme, the conductive layer CL may not be substantially removed.

Figure 8:
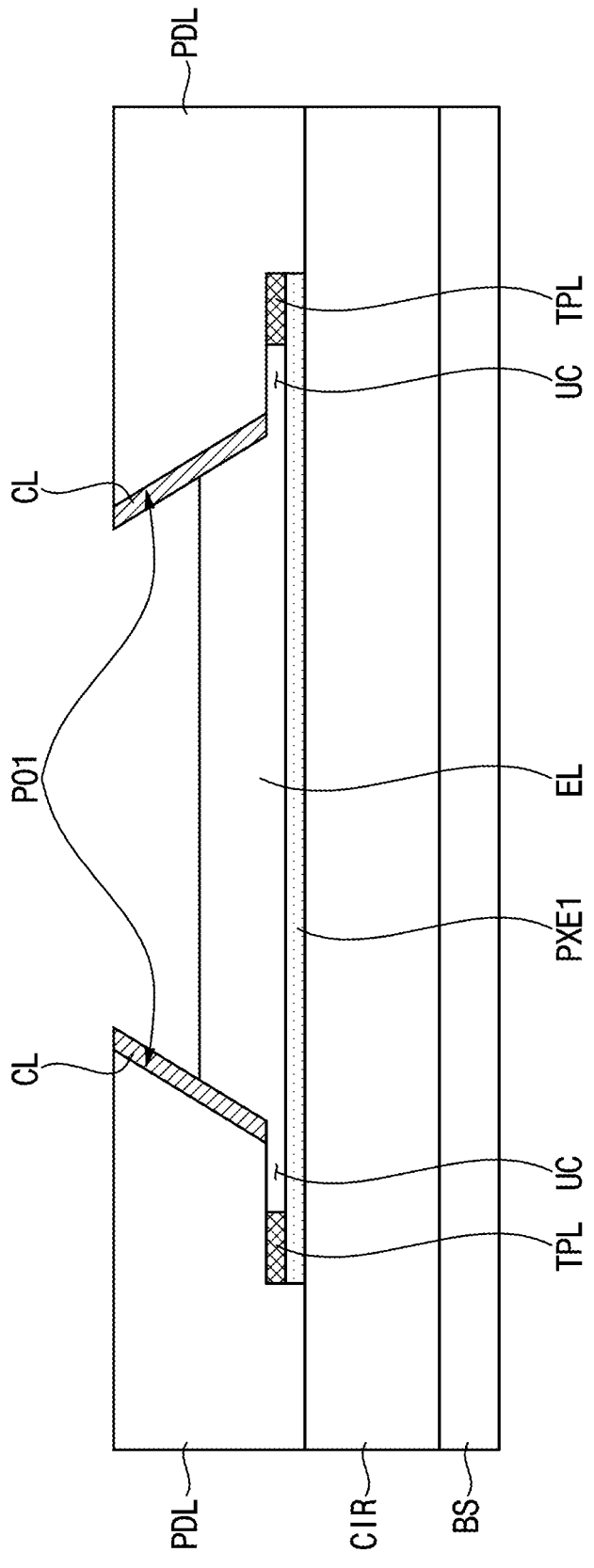

Referring to FIG. 8, the light emitting material EL may be formed in the first pixel opening PO1. The light emitting material EL in the first pixel opening PO1 may fill the undercut space UC. In addition, the top surface of the light emitting material EL may be positioned below the top surface of the pixel defining layer PDL. The light emitting material EL may be formed by an inkjet scheme.

According to the present disclosure, the side surface of the pixel defining layer PDL may have a reverse tapered shape with respect to the top surface of the circuit layer CIR. Accordingly, when the light emitting material EL is formed by the inkjet scheme, ink discharged into the first pixel opening PO1 may be prevented from overflowing.

In an embodiment, the pixel defining layer PDL may have ink-phobic properties to the ink, and the conductive layer CL may have ink-philic properties to the ink. Accordingly, even when the ink is misplaced on the top surface of the pixel defining layer PDL, the misplaced ink may be accommodated in the first pixel opening PO1 due to the ink-phobic properties of the pixel defining layer PDL and the ink-philic properties of the conductive layer CL.

In an embodiment, upon forming the pixel defining layer PDL described with reference to FIG. 4, a part of the organic insulating material may remain in the first pixel opening PO1 without being completely removed, thereby forming residual organic insulating material. The ink discharged into the first pixel opening PO1 may overflow due to the ink-phobic properties of the residual organic insulating material. According to the present disclosure, the preliminary sacrificial layer P_TPL may be formed on the first pixel electrode PXE1 (see FIG. 3), the pixel defining layer PDL is formed (see FIG. 4), and then the sacrificial layer TPL may be formed by removing the part of the preliminary sacrificial layer P_TPL (see FIGS. 7 and 8). Thus, the residual organic insulating material may be formed on the preliminary sacrificial layer P_TPL, and accordingly, the residual organic insulating material may be removed together with the part of the preliminary sacrificial layer P_TPL. In other words, the residual organic insulating material may not be substantially present in the first pixel opening PO1, so that the ink can be prevented from overflowing.

Referring back to FIG. 2, the common electrode CE may be formed on the pixel defining layer PDL and the light emitting material EL. The common electrode CE may be formed by thermal evaporation scheme, and may have a relatively thin deposition thickness compared to a deposition thickness of the above-described preliminary conductive layer P_CL. Accordingly, the common electrode CE may not cover the side surface of the pixel defining layer PDL (or the conductive layer CL covering the side surface of the pixel defining layer PDL), and the first common electrode CE1 covering the top surface of the light emitting material EL within the first pixel opening PO1 and the second common electrode CE2 covering the top surface of the pixel defining layer PDL may be formed.

Figure 9:
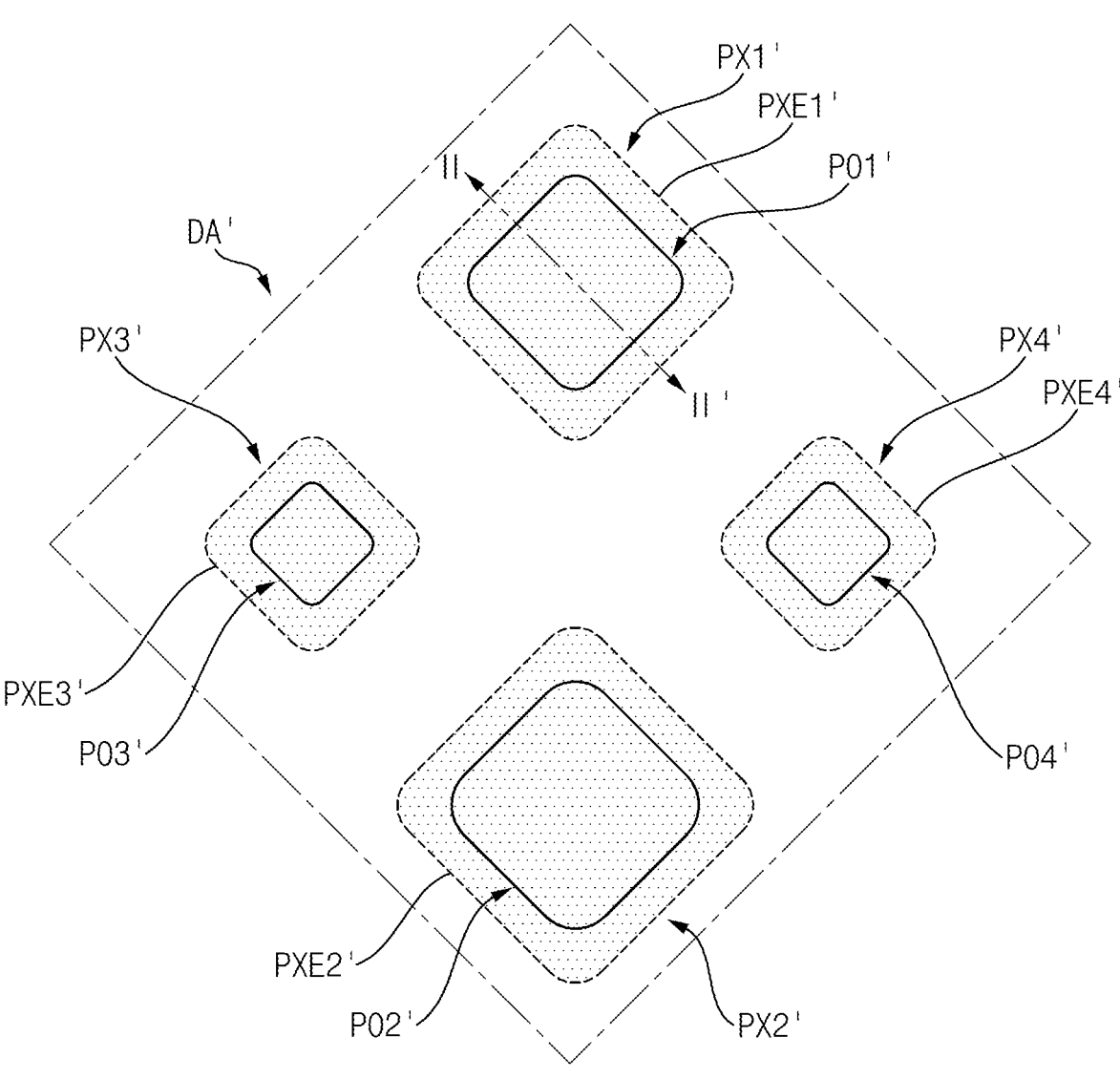
FIGS. 9 and 10 are views for explaining a display device according to an embodiment of the present disclosure.
Figure 10:
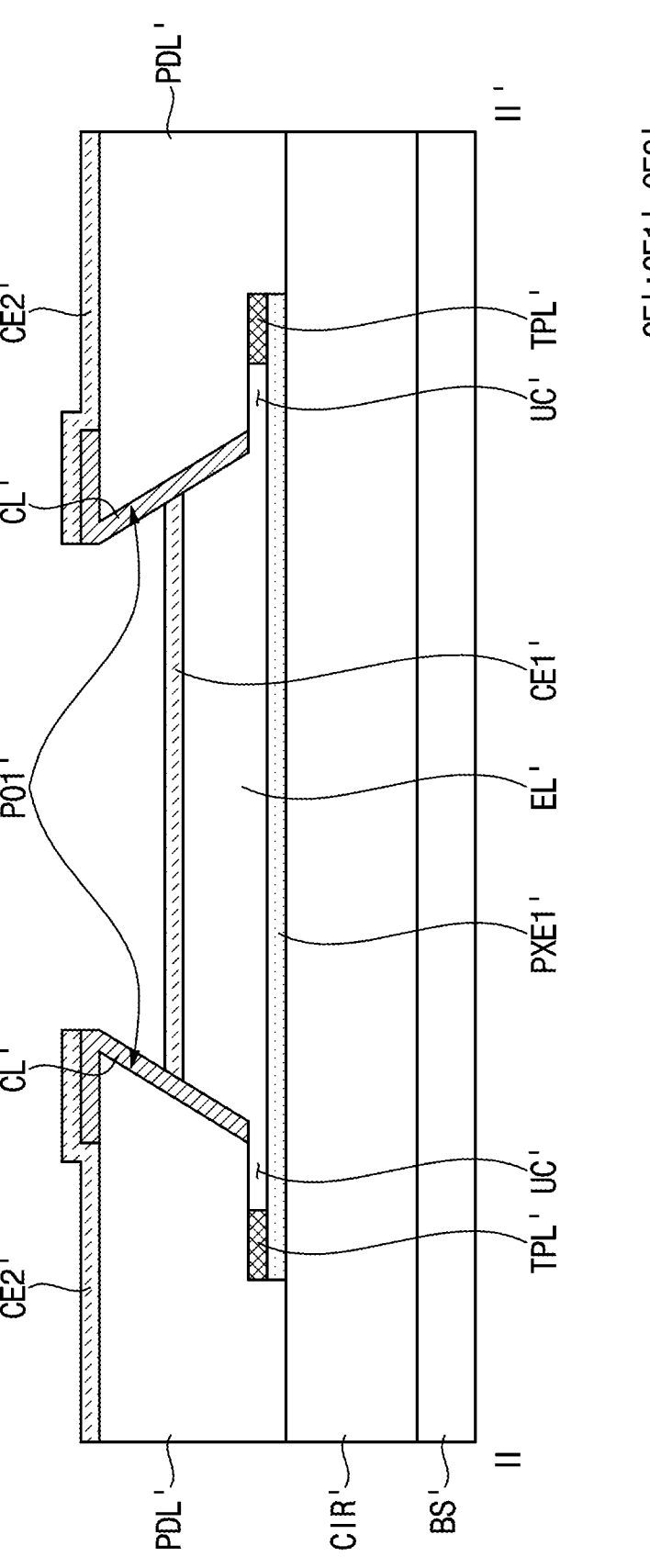

FIGS. 9 and 10 are views for explaining a display device according to an embodiment of the present disclosure. FIG.

9 is a plan view showing a part of the display device according to the embodiment. FIG. 10 is a sectional view taken along line of FIG. 9.

Referring to FIG. 9, the display device may include a display area DA'. A plurality of pixels for emitting light may be arranged in the display area DA', and accordingly, an image may be displayed in the display area DA'. For example, first to fourth pixels PX1', PX2', PX3' and PX4' may be arranged in the display area DA'.

The first to fourth pixels PX1', PX2', PX3' and PX4' and the first to fourth pixel electrodes PXE1', PXE2', PXE3' and PXE4' included in the first to fourth pixels PX1', PX2', PX3' and PX4' shown in FIG. 9 may be substantially the same as the first to fourth pixels PX1, PX2, PX3 and PX4, and first to fourth pixel electrodes PXE1, PXE2, PXE3 and PXE4 described with reference to FIG. 1. The first to fourth pixels PX1', PX2', PX3' and PX4' may have first to fourth openings PO1', PO2', PO3' and PO4'. Accordingly, duplicate descriptions will be omitted.

Referring to FIGS. 9 and 10, the display device may include a base substrate BS', a circuit layer CIR', a first pixel electrode PXE1', a sacrificial layer TPL', a pixel defining layer PDL', a light emitting material EL', a conductive layer CL', and a common electrode CE'. The circuit layer CIR', the first pixel electrode PXE1', the light emitting material EL', and the common electrode CE' may define a first pixel PX1'.

The base substrate BS', the circuit layer CIR', the first pixel electrode PXE1', the sacrificial layer TPL', the pixel defining layer PDL', and the light emitting material EL' may be substantially the same as the base substrate BS, the circuit layer CIR, the first pixel electrode PXE1, the sacrificial layer TPL, the pixel defining layer PDL, and the light emitting material EL described with reference to FIG. 2. Accordingly, duplicate descriptions will be omitted.

The conductive layer CL' may cover a side surface of the pixel defining layer PDL'. In addition, the conductive layer CL' may extend from the side surface of the pixel defining layer PDL' so as to further cover a part of a top surface of the pixel defining layer PDL'. The conductive layer CL' may be spaced apart from the first pixel electrode PXE1' and the sacrificial layer TPL'. The conductive layer CL' may include a conductive material. For example, the conductive layer CL' may include metal, metal oxide and the like.

The common electrode CE' may be arranged on the pixel defining layer PDL', a part of the conductive layer CL' arranged on the pixel defining layer PDL', and the light emitting material EL'. The common electrode CE' may include a conductive material having relatively high light transmittance.

The common electrode CE' may include a first common electrode CE1' and a second common electrode CE2'. The first common electrode CE1' may cover a top surface of the light emitting material EL' within the first pixel opening PO1'. The first common electrode CE1' may come into contact with the conductive layer CL' within the first pixel opening PO1'. The second common electrode CE2' may cover the top surface of the pixel defining layer PDL' and the part of the conductive layer CL' arranged on the pixel defining layer PDL'. Accordingly, the second common electrode CE2' may come into contact with the part of the conductive layer CL'. In other words, each of the first common electrode CE1' and the second common electrode CE2' may come into contact with the conductive layer CL', and accordingly, the first common electrode CE1' and the second common electrode CE2' may be electrically connected to each other through the conductive layer CL'.

Figure 11:
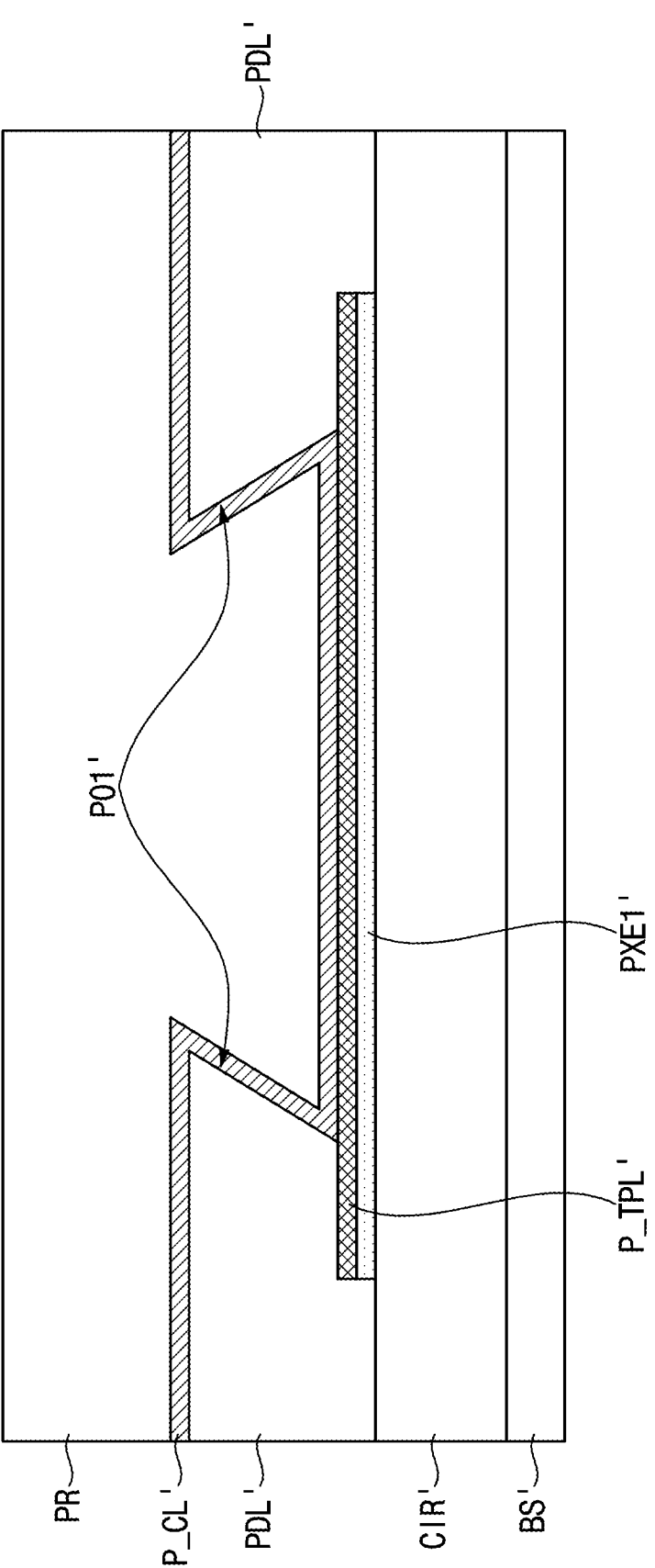
FIGS. 11, 12, and 13 are views for explaining a method for manufacturing a display device according to an embodiment of the present disclosure.
Figure 12:
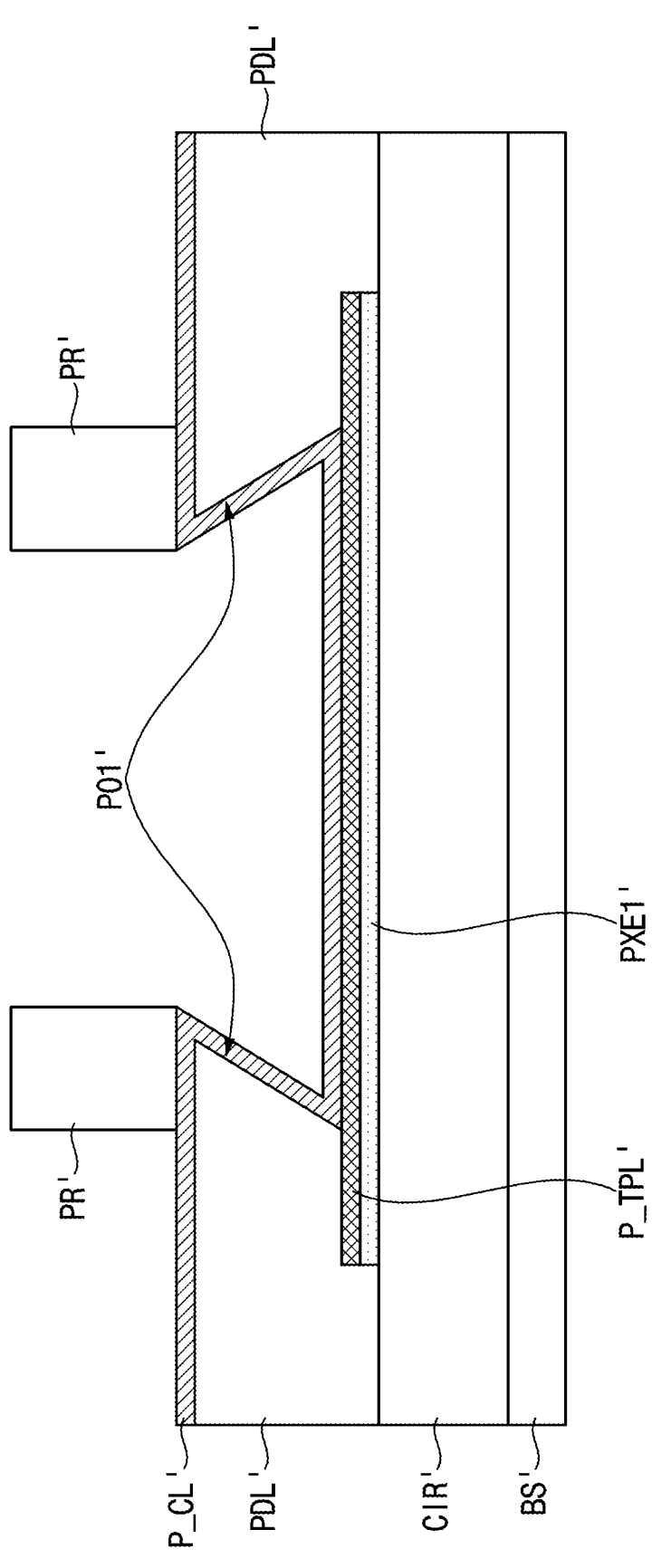
Figure 13:
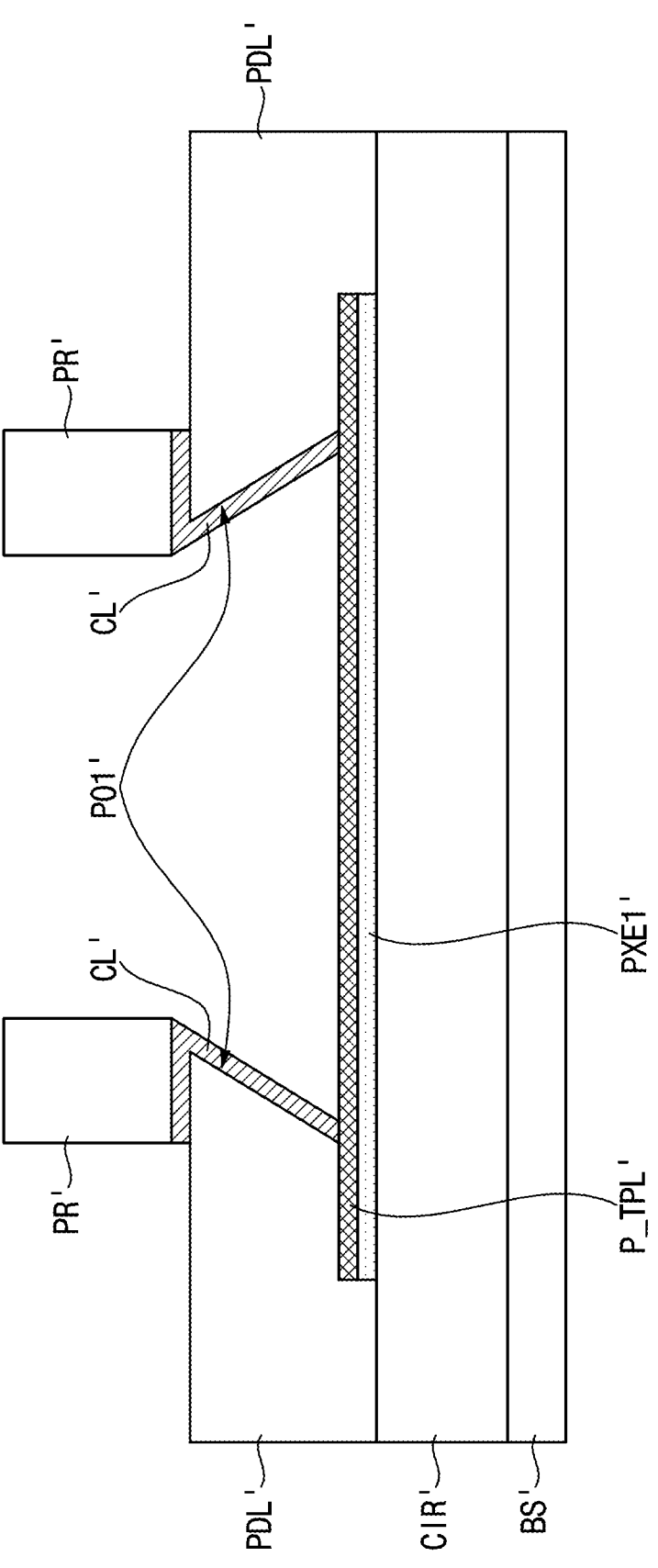

FIGS. 11 to 13 are views for explaining a method for manufacturing a display device according to an embodiment of the present disclosure. Descriptions duplicate to the method for manufacturing the display device according to the embodiment of the present disclosure described with reference to FIGS. 2 to 8 will be omitted.

Referring to FIG. 11, after forming the preliminary conductive layer P_CL' (see FIGS. 3 and 5), a photoresist material PR may be formed to cover the preliminary conductive layer P_CL'.

Referring to FIG. 12, a part of the photoresist material PR may be removed, so that a photoresist pattern PR' may be formed so as to correspond to the part of the conductive layer CL' arranged on the pixel defining layer PDL'.

Referring to FIG. 13, the conductive layer CL' may be formed by removing a part of the preliminary conductive layer P_CL' using the photoresist pattern PR' as a mask. The part of the preliminary conductive layer P_CL' may be removed by the anisotropic dry etching scheme. After the conductive layer CL' is formed, the photoresist pattern PR' may be removed. After the photoresist pattern PR' is removed, the sacrificial layer TPL' may be formed (see FIG. 7), and the light emitting material EL' may be formed (see FIG. 8). Thereafter, the common electrode CE' may be formed on the pixel defining layer PDL', the part of the conductive layer CL' arranged on the pixel defining layer PDL', and the light emitting material EL'.

Referring back to FIG. 6, when the part of the preliminary conductive layer P_CL is removed by the anisotropic dry etching scheme, an upper portion of the preliminary conductive layer P_CL covering the side surface of the pixel defining layer PDL may be further removed due to over-etching. Accordingly, since the second common electrode CE2 may fail to come into contact with the conductive layer CL, a problem may occur in which the second common electrode CE2 is disconnected from the first common electrode CE1.

Referring back to FIG. 13, the part of the conductive layer CL' may be formed on the pixel defining layer PDL' by using the photoresist pattern PR', and the part of the conductive layer CL' may come into contact with the second common electrode CE2'. Accordingly, the problem in which the second common electrode CE2' is disconnected from the first common electrode CE1' by the over-etching may be prevented.

Figure 14:
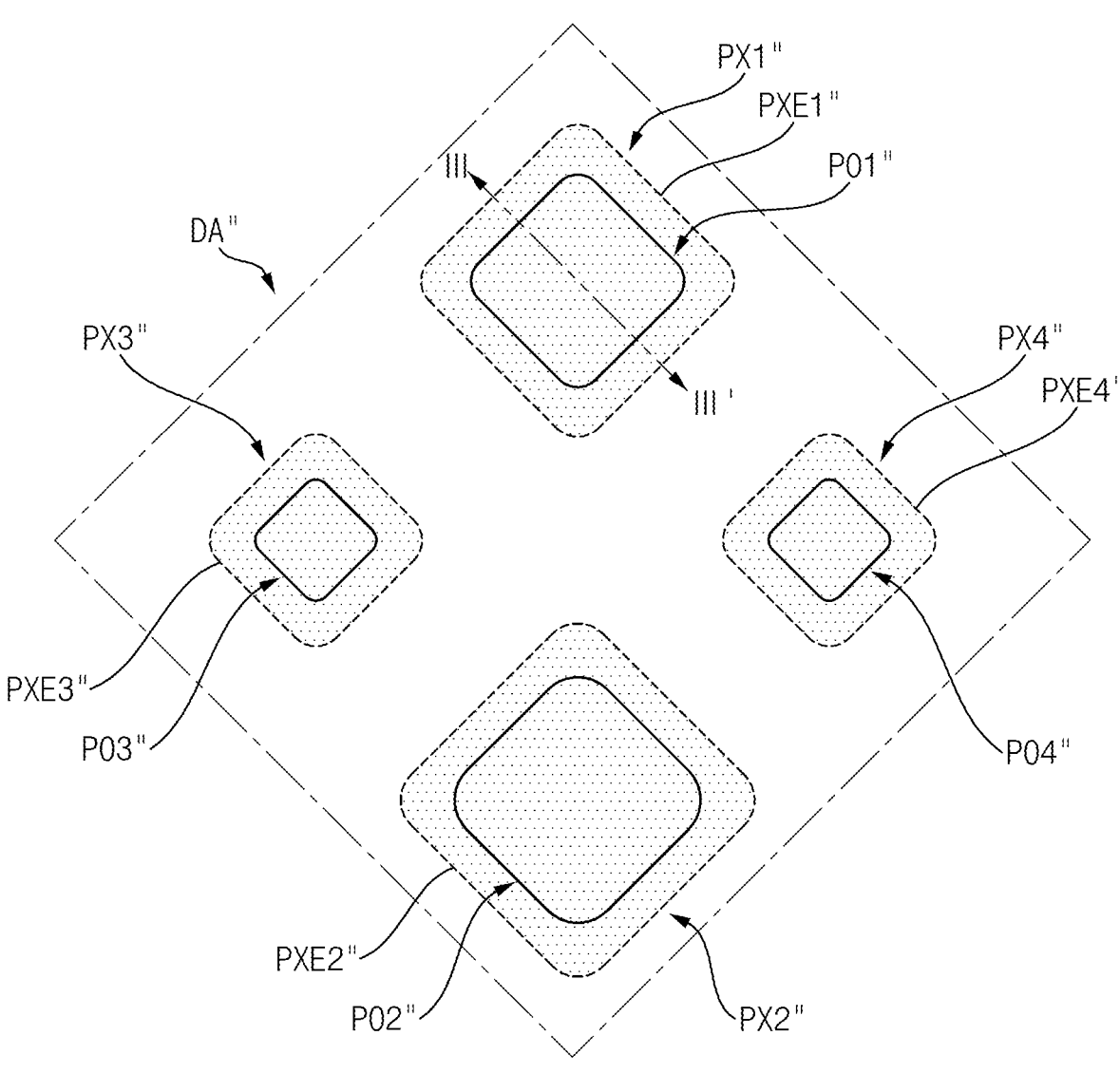
FIGS. 14 and 15 are views for explaining a display device according to an embodiment of the present disclosure.
Figure 15:
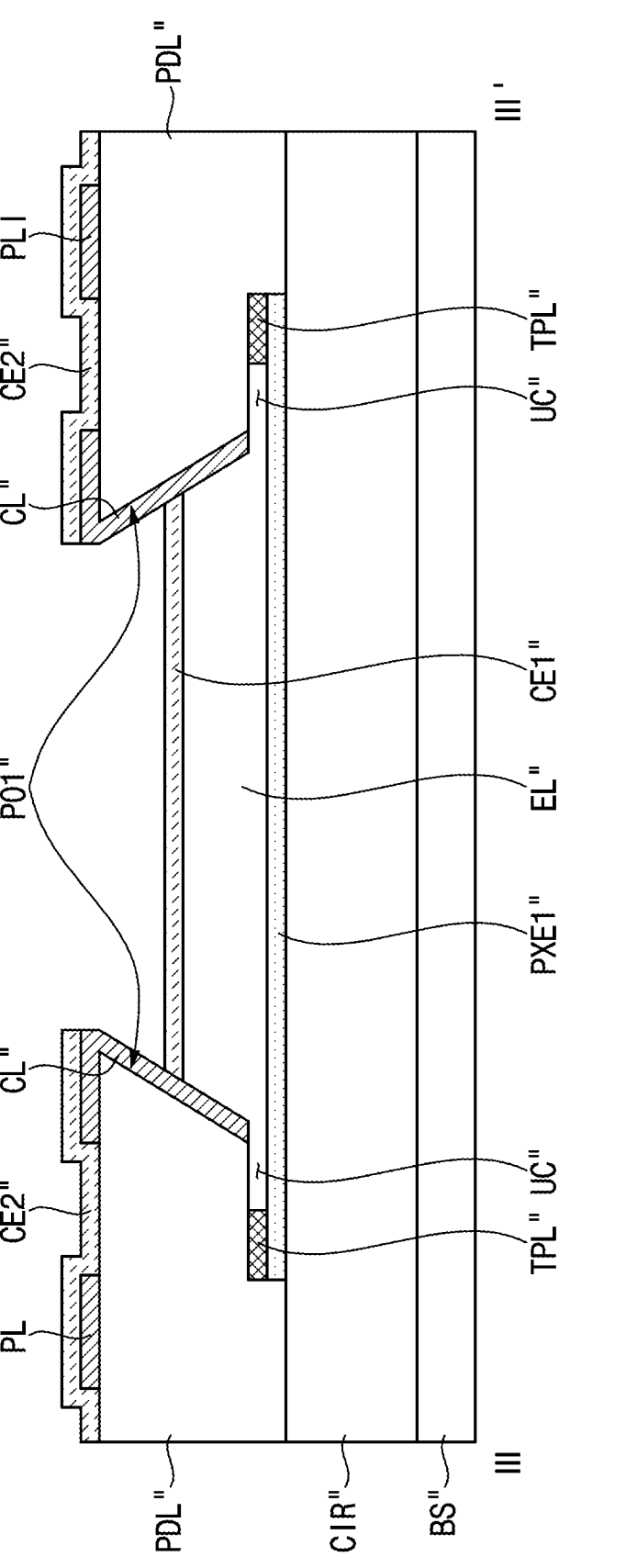

FIGS. 14 and 15 are views for explaining a display device according to an embodiment of the present disclosure. FIG. 14 is a plan view showing a part of the display device according to the embodiment. FIG. 15 is a sectional view taken along line of FIG. 14.

Referring to FIG. 14, the display device may include a display area DA". A plurality of pixels for emitting light may be arranged in the display area DA", and accordingly, an image may be displayed in the display area DA". For example, first to fourth pixels PX1", PX2", PX3" and PX4" may be arranged in the display area DA".

the first to fourth pixels PX1", PX2", PX3" and PX4" and the first to fourth pixel electrodes PXE1", PXE2", PXE3" and PXE4" included in the first to fourth pixels PX1", PX2", PX3" and PX4" shown in FIG. 14 may be substantially the same as the first to fourth pixels PX1', PX2', PX3' and PX4' and the first to fourth pixel electrodes PXE1', PXE2', PXE3' and PXE4' described with reference to FIG. 9. The first to fourth pixels PX1", PX2", PX3" and PX4" may have first to fourth openings PO1", PO2", PO3" and PO4". Accordingly, duplicate descriptions will be omitted.

Referring to FIGS. 14 and 15, the display device may include a base substrate BS", a circuit layer CIR", a first pixel electrode PXE1", a sacrificial layer TPL", a pixel defining layer PDL", a light emitting material EL", a conductive layer CL", a protective pattern PL and a common electrode CE". The circuit layer CIR", the first pixel electrode PXE1", the light emitting material EL", and the common electrode CE" may define a first pixel PX1".

The base substrate BS", the circuit layer CIR", the first pixel electrode PXE1", the sacrificial layer TPL", the pixel defining layer PDL", the conductive layer CL" and the light emitting material EL" may be substantially the same as the base substrate BS', the circuit layer CIR', the first pixel electrode PXE1', the sacrificial layer TPL', the pixel defining layer PDL', the conductive layer CL' and the light emitting material EL' described with reference to FIG. 10. Accordingly, duplicate descriptions will be omitted.

The protective pattern PL may be arranged on the pixel defining layer PDL. The protective pattern PL may include the same material as the conductive layer CL", and may be formed through the same process as the process of forming the conductive layer CL". For example, in the process of forming the conductive layer CL' described with reference to FIGS. 11 to 13, the photoresist pattern PR' is added to correspond to the protective pattern PL, so that the protective pattern PL may be formed. The protective pattern PL may serve to prevent a damage (for example, damage due to arching) caused by the anisotropic dry etching scheme.

The protective pattern PL may have various different shapes. FIG. 15 shows the embodiment in which the protective pattern PL and the conductive layer CL" are spaced apart from each other, however, the protective pattern PL may come into contact with the conductive layer CL".

The common electrode CE" may be arranged on the pixel defining layer PDL", a part of the conductive layer CL" arranged on the pixel defining layer PDL", the protective pattern PL, and the light emitting material EL". The common electrode CE" may include a conductive material having relatively high light transmittance.

The common electrode CE" may include a first common electrode CE1" and a second common electrode CE2". The first common electrode CE1" may cover a top surface of the light emitting material EL" within the first pixel opening PO1". The first common electrode CE1" may come into contact with the conductive layer CL" within the first pixel opening PO1". The second common electrode CE2" may cover the top surface of the pixel defining layer PDL', the part of the conductive layer CL' arranged on the pixel defining layer PDL', and the protective pattern PL. Accordingly, the second common electrode CE2' may come into contact with the part of the conductive layer CL". In other words, each of the first common electrode CE1" and the second common electrode CE2" may come into contact with the conductive layer CL", and Accordingly, the first common electrode CE1" and the second common electrode CE2" may be electrically connected to each other through the conductive layer CL".

The present disclosure may be applied to various electronic apparatuses including a display device. For example, the present disclosure may be applied to high-resolution smartphones, smart pads, smart watches, tablet PCs, vehicle display devices, televisions, computer monitors, and the like.

The present disclosure has been described with reference to exemplary embodiments, however, it will be apparent to a person having ordinary skill in the art that various modifications and variations can be made in the present disclosure without departing from the scope and spirit of the following appended claims.

What is claimed is:

1. A display device comprising:

a substrate;

a pixel electrode arranged on the substrate;

a sacrificial layer arranged on the pixel electrode so as to be adjacent to an outer boundary of the pixel electrode when viewed in a plan view;

a pixel defining layer arranged on the substrate, coming into direct contact with an entire top surface of the sacrificial layer, and defining a pixel opening exposing a part of the pixel electrode;

a conductive layer covering a side surface of the pixel defining layer defining the pixel opening;

a light emitting material arranged on the pixel electrode within the pixel opening; and a common electrode including a first common electrode covering a top surface of the light emitting material in the pixel opening, and a second common electrode covering a top surface of the pixel defining layer, wherein the first common electrode and the second common electrode are electrically connected through the conductive layer.

2. The display device of claim 1, wherein the pixel-defining layer defines an undercut space while being spaced apart from a part of the pixel electrode adjacent to the sacrificial layer, and the conductive layer is spaced apart from the pixel electrode.

3. The display device of claim 2, wherein the light emitting material fills the undercut space, and the light emitting material is arranged between the conductive layer and the pixel electrode.

4. The display device of claim 1, wherein each of the first common electrode and the second common electrode comes into direct contact with the conductive layer.

5. The display device of claim 1, wherein the sacrificial layer is spaced apart from the conductive layer.

6. The display device of claim 1, wherein the side surface of the pixel defining layer has a reverse taper shape with respect to a top surface of the pixel electrode.

7. The display device of claim 1, wherein the conductive layer further extends from the side surface of the pixel defining layer to the top surface of the pixel defining layer adjacent to the side surface of the pixel defining layer.

8. The display device of claim 7, wherein the second common electrode further covers the conductive layer arranged on the top surface of the pixel defining layer.

9. The display device of claim 1, further comprising:

a protective pattern arranged on the top surface of the pixel defining layer.

10. The display device of claim 9, wherein the protective pattern includes a material identical to the conductive layer.

11. The display device of claim 9, wherein the second common electrode further covers the protective pattern.

* * * * *